US006813177B2

(12) United States Patent
Lowrey et al.

(10) Patent No.: US 6,813,177 B2
(45) Date of Patent: Nov. 2, 2004

(54) METHOD AND SYSTEM TO STORE INFORMATION

(75) Inventors: Tyler A. Lowrey, San Jose, CA (US); Ward D. Parkinson, Boise, ID (US)

(73) Assignee: Ovoynx, Inc., Boise, ID (US)

( * ) Notice: Subject to any disclaimer, the term of this patent is extended or adjusted under 35 U.S.C. 154(b) by 70 days.

(21) Appl. No.: 10/319,756

(22) Filed: Dec. 13, 2002

(65) Prior Publication Data

US 2004/0114419 A1 Jun. 17, 2004

(51) Int. Cl.[7] .............................................. G11C 11/00
(52) U.S. Cl. ...................... 365/148; 365/113; 365/163
(58) Field of Search ................................. 365/148, 113, 365/163

(56) References Cited

U.S. PATENT DOCUMENTS

| | | | |
|---|---|---|---|
| 3,271,591 A | 9/1966 | Ovshinsky | 327/500 |
| 3,530,441 A | 9/1970 | Ovshinsky | 365/113 |
| 5,296,716 A | 3/1994 | Ovshinsky et al. | 257/3 |
| 5,541,869 A * | 7/1996 | Rose et al. | 365/100 |
| 5,789,758 A | 8/1998 | Reinberg | 257/3 |
| 5,879,955 A | 3/1999 | Gonzalez et al. | 437/195 |
| 5,920,788 A | 7/1999 | Reinberg | 438/466 |
| 5,933,365 A | 8/1999 | Klersy et al. | 365/148 |
| 5,970,336 A | 10/1999 | Wolstenholme et al. | 433/238 |
| 5,998,244 A | 12/1999 | Wolstenholme et al. | 438/138 |
| 6,002,140 A | 12/1999 | Gonzalez et al. | 257/3 |
| 6,031,287 A | 2/2000 | Harshfield | 257/734 |
| 6,085,341 A | 7/2000 | Greason et al. | 714/718 |
| 6,087,674 A | 7/2000 | Ovshinsky et al. | 250/505.1 |
| 6,141,241 A | 10/2000 | Ovshinsky et al. | 365/163 |
| 6,153,890 A | 11/2000 | Wolstenholme et al. | 257/3 |
| 6,229,157 B1 | 5/2001 | Sandhu | 257/75 |
| 6,570,784 B2 * | 5/2003 | Lowrey | 365/163 |
| 6,625,054 B2 * | 9/2003 | Lowrey et al. | 365/148 |
| 6,687,153 B2 * | 2/2004 | Lowrey | 365/163 |

OTHER PUBLICATIONS

US patent application, pending, 09/895,135, filed Jun. 29, 2001, Tyler Lowrey (P11409), US patent No. 6,570,784.

US patent application, pending, 10/034,146, filed Dec. 28, 2001, Manzur Gill et al. (P12860), U.S. patent No. 6,625,054.

Hwang, Y.N., Hong, J.S., Lee, S.H., Ahn, S.J., Jeong, G.T., Koh, G.H., Kim, H.J., Jeong, W.C., Lee, S.Y., Park, J.H., Ryoo, K.C.., Horii, H., Ha, Y.H., Yi, J.H., Cho, W.Y., Kim, Y.T., Lee, K.H., Joo, S.H., Park, S.O., Jeong, U.I., Jeong, H.S. and Kim, Kinam, "Completely CMOS–Compatible Phase–Change Nonvolatile RAM Using NMOS Cell Transistors," presented at 2003 19th IEEE Non–Volatile Semiconductor Memory Workshop, Monterey, California, Feb. 26–20, 2003.

(List continued on next page.)

Primary Examiner—Tan T. Nguyen
(74) Attorney, Agent, or Firm—Trop, Pruner & Hu, P.C.

(57) ABSTRACT

Briefly, in accordance with an embodiment of the invention, a method and system to program a memory material is provided. The method may include applying three signals having different durations and different amplitudes to a memory material to program the memory material to a predetermined state.

33 Claims, 7 Drawing Sheets

OTHER PUBLICATIONS

Ha, Y.H., Yi, J.H., Horii, H., Park, J.H., Joo, S.H., Park, S.O., Chung, U–In and Moon, J.T., "An Edge Contact Type Cell for Phase Change RAM Featuring Very Low Power Consumption," presented at IEEE 2003 Symposium on VLSI Technology, Kyoto, Japan, Jun. 12–14, 2003.

Hwang, Y.N., Hong, J.S., Lee, S.H., Ahn, S.J., Jeong, G.T., Koh, G.H., Oh, J.H., Kim, H.J., Jeong, W.C., Lee, S.Y., Park, J.H., Ryoo, K.C., Horii, H., Ha, Y.H., Yi, J.H., Cho, W.Y., Kim, Y.T., Lee, K.H., Joo, S.H., Park, S.O., Chung, U.I., Jeong, H.S., and Kim, Kinam, "Full Integration and Reliability Evaluation of Phase–change RAM Based on 0.24 mm–CMOS Technologies," presented at IEEE 2003 Symposium on VLSI Technology, Kyoto, Japan, Jun. 12–14, 2003.

Horii, H., Yi, J.H., Park, J.H., Ha, Y.H., Baek, I.G., Park., S.O., Hwang, Y.N., Lee, S.H., Kim, Y.T., Lee, K.H., Chung, U–In and Moon, J.T., "A Novel Cell Technology Using N–doped GeSbTe Films for PhaseChange Ram," presented at IEEE 2003 Symposium on VLSI Technology, Kyoto, Japan, Jun. 12–14, 2003.

* cited by examiner

METHOD AND SYSTEM TO STORE INFORMATION

BACKGROUND

Phase change materials that are used in memory devices may exhibit at least two different states and therefore may be used to store a bit of data. These states may be referred to as the amorphous and crystalline states. These states may be distinguished since the amorphous state generally exhibits higher resistivity than the crystalline state. Generally, the amorphous state involves a more disordered atomic structure.

Phase change materials in a memory cell may be programmed by altering a resistance of the material. However, variations in the materials, fabrication processes, and operating environment may cause the resistance of a phase change material to vary or drift after the phase change material is programmed. Thus, some cells originally programmed to one state may undesirably change to a different state after programming or the resistance of some cells may drift to a level that may not provide for adequate sense margins between the states.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
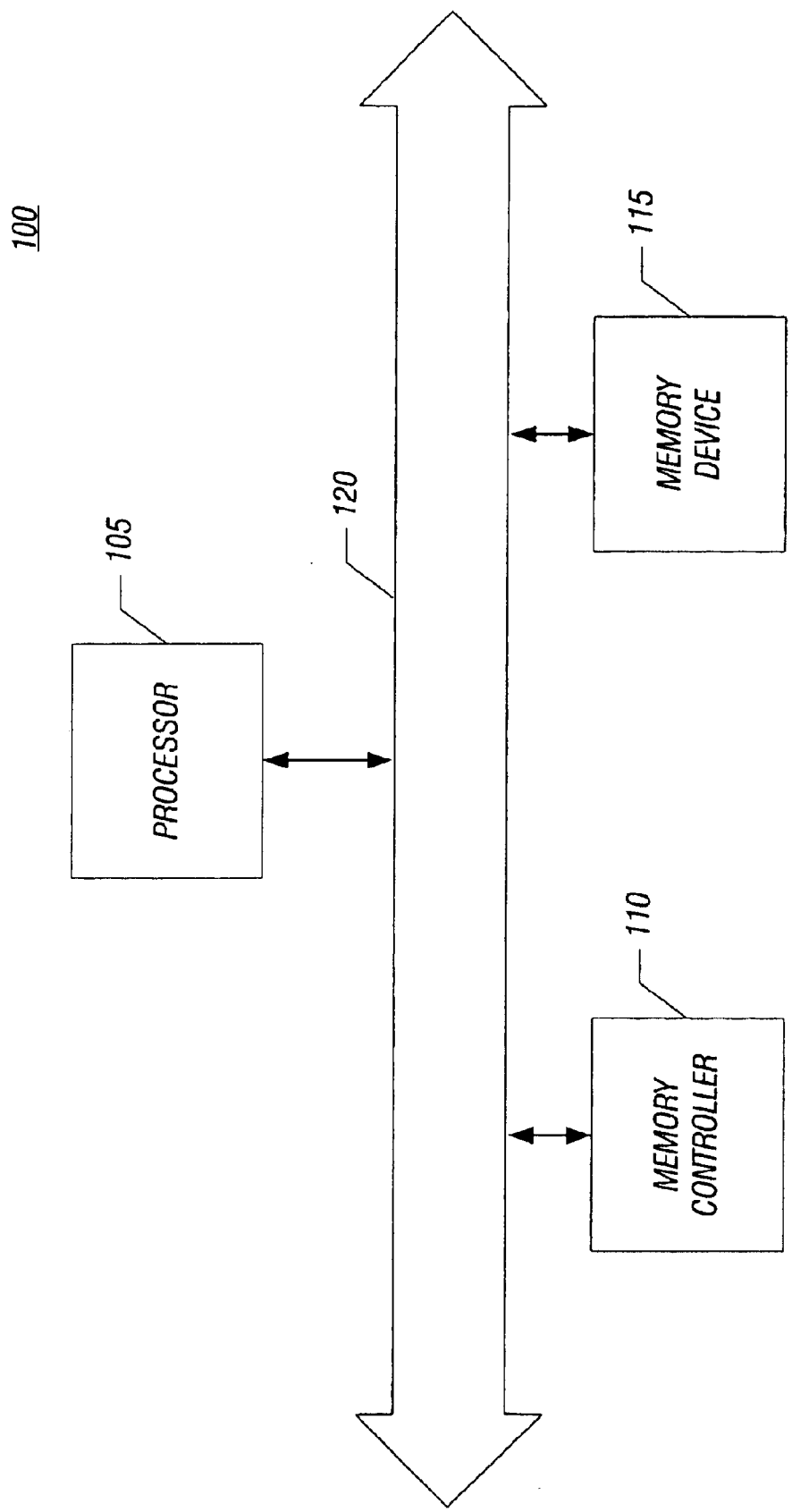
FIG. 1 is a block diagram illustrating a computing system in accordance with an embodiment of the claimed subject matter.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the claimed subject matter. However, it will be understood by those skilled in the art that the claimed subject matter may be practiced without these specific details. In other instances, well-known methods, procedures, components and circuits have not been described in detail so as not to obscure the claimed subject matter.

Embodiments of the claimed subject matter may include an apparatus for performing the operations herein. This apparatus may be specially constructed for the desired purposes, or it may comprise a general purpose computing device selectively activated or reconfigured by a program stored in the device. Such a program may be stored on a storage medium, such as, but is not limited to, any type of disk including floppy disks, optical disks, CD-ROMs, magnetic-optical disks, electromechanical disks, read-only memories (ROMs), random access memories (RAMs), electrically programmable read-only memories (EPROMs), electrically erasable and programmable read only memories (EEPROMs), flash memory, magnetic or optical cards, or any other type of media suitable for storing electronic instructions and data.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Turning to FIG. 1, an embodiment of a computing system 100 is illustrated. Computing system 100 may be used in a variety of applications such as, for example, a personal digital assistant (PDA), a two-way pager, a cellular phone, a portable computer, a desktop computer, a workstation, a server, or video equipment. Although it should be pointed out that the scope and application of the claimed subject matter is in no way limited to these examples.

In this embodiment, computing system 100 may comprise a processor 105, a memory controller 110, a memory device 115 coupled to each other via a bus 120. Bus 120 may be a data path comprising, for example, a collection of data lines to transmit data from one part of computing system 100 to another.

Although the scope of the claimed subject matter is not limited in this respect, processor 105 may comprise, for example, one or more microprocessors, digital signal processors, microcontrollers, or the like. Processor 105 may execute a software process such as, for example, a software program or an operating system, wherein the software process may use digital information such as, for example, data and/or instructions.

In some embodiments, memory controller 110 together with processor 105 may control memory device 115. For example, memory controller 110 may control the transfer of information within computing system 100, e.g., between processor 110, memory controller 110, and memory device 115. That is, memory controller 110 may generate control signals, address signals, and data signals that may be associated with a particular write or read operation to memory device 115. A particular write or read operation may involve concurrently writing information to or reading information from memory device 115.

Memory device 115 may be referred to as a storage device and may be adapted to store information such as, for example, instructions or data used by an operating system or a software program that may be executed by processor 105. Although the scope of the claimed subject matter is not limited in this respect, in some embodiments, memory device 115 may be a memory array comprising a plurality of memory cells that may include a memory material such as, for example, a phase change material. One example of a phase change material is a chalcogenide material that may be programmed into different memory states to store information. This material may be, for example, a chalcogenide alloy that exhibits a reversible structural phase change from a relatively amorphous state to a relatively crystalline or a polycrystalline state. Due to the reversible structure, the phase change material may change from the amorphous state to the crystalline state and may revert back to the amorphous state thereafter, or vice versa, in response to temperature changes. A polycrystalline state may be defined as a state where multiple grain crystals are present with the possibility of some portions of the phase change material remaining amorphous.

A variety of phase change alloys may be used. For example, a chalcogenide alloy containing one or more elements from Column VI of the periodic table may be used in memory device 115. By way of example, memory device 115 may comprise GeSbTe alloys.

A volume of the chalcogenide alloy may be integrated into a memory cell to allow the cell to act as a nonvolatile programmable resistor, which reversibly changes between higher and lower resistance states. Crystallization in phase change materials may be a result of both the temperature and the amount of time the material spends at that temperature. Accordingly, the phase change may be induced by resistive heating using a current flowing through the phase change material. In some embodiments, the programmable resistor may exhibit greater than 40 times dynamic range of resistivity between the crystalline state (low resistivity) and the amorphous state (high resistivity), and may also be capable of exhibiting multiple, intermediate states that allow multi-bit storage in a memory cell. Accordingly, the resistance of the phase change material may be altered to store information in the material and the information stored in the phase change material may be read by measuring the material's resistance.

By way of example, in a binary system storing one bit of data, a first state may be defined as the "1" state or "set" state and a second state may be defined as the "0" state or the "reset" state, wherein the reset state may be defined as a substantially amorphous state and the set state may be defined as a substantially crystalline state, although the scope of the claimed subject matter is not limited in this respect.

In multi-level cell (MLC) operation, a phase change material may be used to exhibit multiple states to store multiple bits of data, wherein changing the state of a phase change material having more than two states may be accomplished by changing the resistivity/conductivity of the phase change material. For purposes of illustration, the embodiments herein describe binary systems that store 2-bits per memory cell using four states. A (0,0) state may be defined as a substantially amorphous (high resistivity) state; a (1,1) state may be defined as a substantially crystalline (low resistivity); and a (0,1) state and a (1,0) state may be intermediate states between the substantially amorphous and substantially crystalline states. These intermediate states may be referred to as heterogeneous states. In addition, the substantially amorphous state may also be referred to as a relatively amorphous state or a generally amorphous state and the substantially crystalline state may be referred to as a relatively crystalline state or a generally crystalline state. In the four state example, the four states of the phase change material may be defined to have the following resistive relationship: the resistance of the phase change material in state (0,0) may be greater than the resistance of the phase change material in state (0,1); the resistance of the phase change material in state (0,1) may be greater than the resistance of the phase change material in state (1,0); and resistance of the phase change material in state (1,0) may be greater than the resistance of the phase change material in state (1,1).

Although a binary 2-bit per cell system is described for purposes of illustration, the scope of the claimed subject matter is not limited in this respect. The principles of the claimed subject matter may be similarly applicable to any system where the phase change material has more than two states. For example, in a nonbinary system, the memory states can be three or some other multiple of a nonbinary base.

Figure 2:
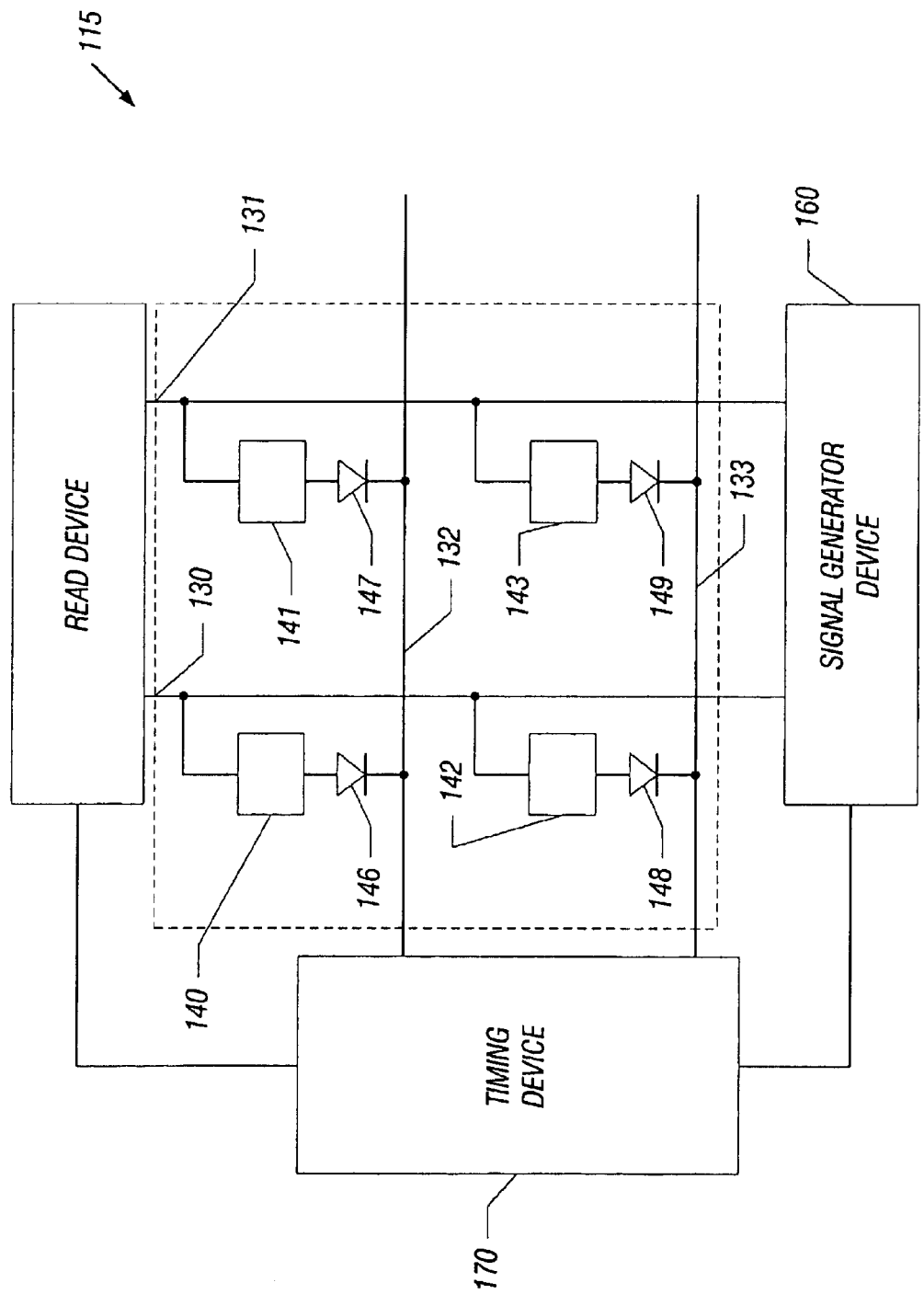
FIG. 2 is schematic diagram illustrating a memory device in accordance with an embodiment of the claimed subject matter.

Turning to FIG. 2, an embodiment of memory device 115 is illustrated. Memory device 115 may include a 2×2 array 139 of memory cells 140, 141, 142, and 143, wherein memory cells 140–143 comprise a phase change material. Although a 2×2 array 139 is illustrated in FIG. 2, the scope of the claimed subject matter is not limited in this respect. For example, memory device 115 may have a larger array of memory cells.

Programming of memory cells 140–143 may comprise one or more write operations and one or more read operations. Memory device 115 may include column lines 130 and 131 and row lines 132 and 133 to select a particular cell of array 139 for a write or read operation. Memory cells 140–143 may be connected to column lines 130 and 131 and may be coupled through cell isolation elements (e.g., diodes 146, 147, 148, and 149) to row lines 132 and 133. Therefore, when a particular memory cell (e.g., memory cell 140) is selected, its associated column line (e.g., 130) may be driven high and its associated row line (e.g., 132) may be driven low to drive current through the memory cell. Diodes 146, 147, 148, and 149 may also be implemented as switches such as, for example, N-channel MOS devices where the source is grounded, gate is decoded, and drain drives the row line.

In this embodiment, memory device 115 further comprises a signal generator device 160 to perform a write operation, a read device 150 to perform a read operation, and a timing device 170 to generate timing signals to assist in the read and write operations. Signal generator device 160 may be adapted to generate programming signals to apply to memory cells 140–143. For example, device 160 may be adapted to generate and apply the programming signals illustrated in FIGS. 3 and 4. In MLC operation, read device 150 may also be used to verify status of memory cells 140–143 during programming. For example, read device 150 may be used to perform a verify operation to determine if the memory material in a memory cell is in a selected state of one of the two or more allowed states after a programming signal is applied to the memory cell.

Read device 150 may include a circuit to read the information stored in the memory cells 140–143. As an example, read device 150 may include a circuit to route a current through memory cell 140 that results in a voltage developing across memory cell 140. This voltage may be proportional to the resistance exhibited by the memory cell. Thus, a higher voltage may indicate that the cell is in a relatively higher resistance state and a lower voltage may indicate that the cell is in a relatively lower resistance state. An example of read device is discussed below with reference to FIG. 6.

As discussed hereinbefore, crystallization in phase change materials may be a result of both the temperature and the amount of time the material spends at that temperature. In some embodiments, applying programming signals (e.g., current signals) having different amplitudes and durations to a phase change material may heat the phase change materials for various durations and may result in altering resistance of the phase change material. In addition, after a programming signal is applied to the memory cell, the resistance of the phase change material may be read to determine if the memory cell was programmed to the desired state. This process of applying programming signals and reading or verifying the resistance of the memory cell may be referred to as a feedback approach for programming the memory cells.

As an example, to program memory cell 140 to a predetermined state, i.e., to a predetermined resistance within a predetermined resistance range, a current signal having a relatively large duration and relatively low amplitude may initially be applied to memory cell 140 to set the resistance of the phase change material in memory cell 140 to a relatively low resistance level. Subsequently, fine tuning of the resistance of the phase change material may be achieved by applying signals having relatively smaller durations and various amplitudes. Applying these signals to memory cell 140 may set the resistance of the phase change material of memory cell 140 to a desired resistance or within a desired resistance range.

Following the initial signal, a read operation may be performed to determine the resulting resistance of the phase change material of memory cell 140 after application of the initial signal. If the target resistance is not achieved after the initial signal, a signal having a relatively shorter duration and a relatively larger amplitude than the initial signal may be applied to memory cell 140 to alter the resistance of the phase change material. Another read operation may be performed to determine the resistance of the phase change material. If the target resistance is not achieved after application of the second signal, another signal having the same or different duration and amplitude as the second signal may be applied to the memory cell to slightly increase or decrease the resistance further. Applying signals having the same or different durations and the same or different amplitudes may be repeated until the resistance of memory cell 140 is within a range determined to be adequate to accurately read information stored in the memory cell. That is, the resistance of the phase change material in memory cell 140 may be adjusted so that adequate margin exists between adjacent memory states. For example, to provide adequate margin, the range around a desired resistance level may be defined to be narrow enough so that there is no overlap into the adjacent state and also defined so that the nonoverlapping space between the adjacent states is adequate to accommodate a threshold for a read device to differentiate between the two adjacent states.

A signal having a relatively larger amplitude may be subsequently applied to memory cell 140 if the resulting resistance is below the target resistance. Conversely, a signal having a relatively smaller amplitude may be subsequently applied to memory cell 140 if the resulting resistance is greater than the target resistance. Consequently, a precise resistance may be obtained by applying a relatively long duration signal followed by signals having relatively shorter durations and the same amplitude or different amplitudes. In addition, providing signals with various durations may provide a relatively faster programming operation compared to applying multiple signals having the same duration.

Figure 3:
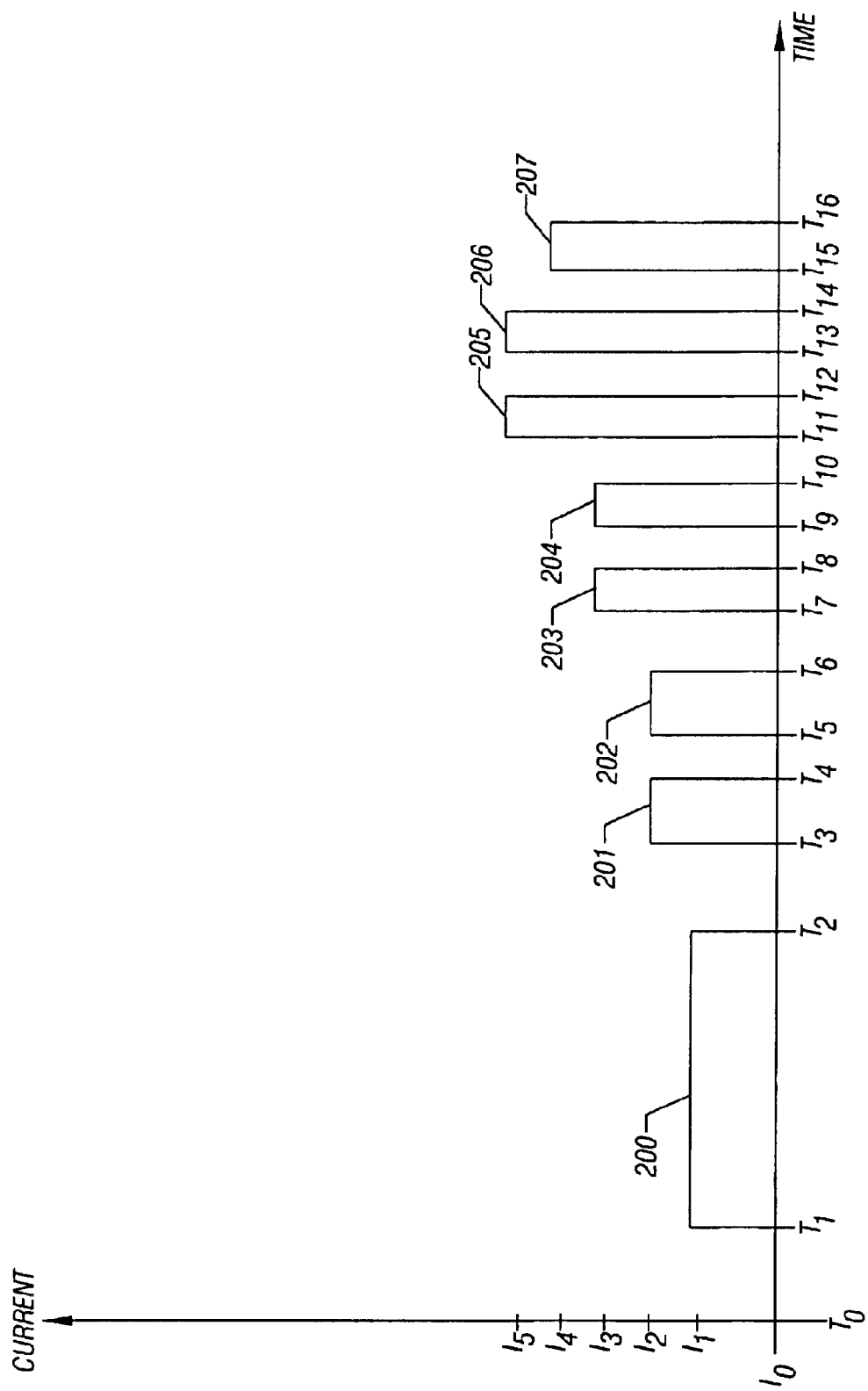
FIG. 3 illustrates a plurality of programming signals in accordance with an embodiment of the claimed subject matter.

Turning to FIG. 3, a plurality of programming signals (200, 201, 202, 203, 204, 205, 206, 207) in accordance with an embodiment of the claimed subject matter are illustrated. In FIG. 3, different times $T_0$-$T_{16}$ are denoted on a TIME axis and different currents $I_0$-$I_5$ are denoted on a CURRENT axis.

In the embodiment illustrated in FIG. 3, signals 200–207 are substantially rectangular current pulses having various amplitudes and/or durations and may be applied to memory cells 140–143 (FIG. 2) to program these cells. In particular, signals 200–207 may be applied to memory cells 140–143 to heat the phase change materials of memory cells 140–143 to set the resistance of the phase change materials, thereby setting the state of the associated memory cell.

The duration of a signal (e.g., the width or pulse width of a signal) may be determined by measuring the amount of time between the beginning and the end of the signal. For example, signal 200 having a minimum amplitude of $I_0$ and a maximum amplitude of $I_1$ begins at time $T_1$ and ends at time $T_2$ and therefore has a duration of $T_2$-$T_1$.

In one embodiment, for MLC operation wherein the phase change materials of memory cells 140–143 are defined as having more than two states, signals 200–207 may be used to set the state of the phase change material in a particular memory cell to one of the more than two states. For example, signals 200–207 may be used to place the phase change material of memory cell 140 to a state (1,1). In other words, signals 200–207 may be applied to memory cell 140 to alter the resistance of memory cell 140 to a predetermined resistance or to a resistance level within a predetermined resistance range that corresponds to state (1,1). As an example, state (1,1) may be defined as a state wherein the resistance of the phase change material of memory cell 140 ranges between approximately 9.5 kilo-ohms (kohms) and 10.5 kohms.

In one embodiment, signal 200, having a relatively smaller amplitude and a relatively longer duration than signals 201–207, may initially be applied to memory cell 140 to set the resistance of the phase change material of memory cell 140 to a relatively low resistance level of, for example, approximately six kohms. As an example, signal 200 may have an amplitude of approximately one milliampere (ma) and a duration or width of approximately 500 nanoseconds (ns), although the scope of the claimed subject matter is not limited in this respect. As may be appreciated, the resulting resistance of a memory material for a particular programming signal may vary due to variations in materials, manufacturing processes, and operating environments.

After applying signal 200 to memory cell 140, the resistance of memory cell 140 may be measured. In the current example, the resistance of the phase change material of memory cell 140 after application of signal 200 is approximately six kohms, which is below the target resistance range of approximately 9.5 kohms to 10.5 kohms.

Applying a signal having a relatively larger amplitude than a previously applied signal to memory cell 140 may increase the resistance of the phase change material of memory cell 140. Signals 201 and 202 may be applied to memory cell 140 after signal 200 to alter the resistance of the phase change material of memory cell 140. In this embodiment, the duration ($T_2$-$T_1$) of signal 200 is greater than the duration ($T_4$-$T_3$) of signal 201 and the duration of signal 200 is greater than the duration ($T_6$-$T_5$) of signal 202.

Further, the maximum amplitude ($I_1$) of signal 200 is less than the maximum amplitudes ($I_2$) of signals 201 and 202. As an example, signals 201 and 202 each have a maximum amplitude of approximately 1.5 ma and signals 201 and 202 each have a duration of approximately 50 ns. In this example, after applying signal 201, the resistance of the phase change material may be increased to about 7.4 kohms. Applying a signal having an amplitude and duration approximately equal to a previously applied signal may increase or decrease the resistance of the phase change material of memory cell 140 by a relatively small increment. In this example, applying signal 202 following signal 201 to memory cell 140 may increase the resistance of the phase change material of memory cell 140 to about 7.7 kohms.

Signals 203 and 204 may be applied to memory cell 140 after signal 202 to alter the resistance of the phase change material of memory cell 140. In this embodiment, the duration ($T_8-T_7$) of signal 203 and the duration ($T_{10}-T_9$) of signal 204 is less than the duration of signal 202. Further, the maximum amplitudes ($I_3$) of signals 203 and 204 are greater than the maximum amplitude ($I_2$) of signal 202. As an example, signals 203 and 204 each have a maximum amplitude of approximately 2 ma and signals 203 and 204 each have a duration of approximately 10 ns. In this example, after applying signal 203, the resistance of the phase change material of memory cell 140 may be increased to about 9 kohms. Applying signal 204 following signal 203 to memory cell 140 may decrease the resistance of the phase change material of memory cell 140 to about 8.8 kohms.

Signals 205 and 206 may be applied to memory cell 140 after signal 204 to alter the resistance of the phase change material of memory cell 140. In this embodiment, the duration ($T_{12}-T_{11}$) of signal 205 and the duration ($T_{14}-T_{13}$) of signal 206 are approximately equal to the duration of signal 204. Further, the maximum amplitudes ($I_5$) of signals 205 and 206 are greater than the maximum amplitude ($I_3$) of signal 204. As an example, signals 205 and 206 each have a maximum amplitude of approximately 3 ma and signals 205 and 206 each have a duration of approximately 10 ns. In this example, after applying signal 205, the resistance of the phase change material of memory cell 140 may be increased to about 11 kohms. Applying signal 206 following signal 205 to memory cell 140 may set the resistance of the phase change material of memory cell 140 to about 11 kohms. In the current example, the resistance of the phase change material of memory cell 140 is approximately 11 kohms after applying signals 205 and 206 and may be referred to as an overshoot condition since the resistance of the phase change material is above the target resistance range.

Signal 207 may be applied to memory cell 140 after signal 206. In this embodiment, the duration ($T_{16}-T_{15}$) of signal 207 is approximately equal to the duration of signal 206 and the maximum amplitude ($I_4$) of signal 207 is less than the maximum amplitude ($I_5$) of signal 206. As an example, signal 207 has a maximum amplitude of approximately 2.5 ma and signal 207 has a duration of approximately 10 ns. In this example, after applying signal 207, the resistance of the phase change material of memory cell 140 may be decreased to about 10 kohms.

The resistance of the phase change material of memory cell 140 may be measured to determine if the target resistance is reached after application of signals 200–207. In this example, the target resistance level is reached after application of signal 207.

Although eight signals are used to program memory cell 140 to a selected resistance in the embodiment illustrated with reference to FIG. 3, this is not a limitation of the claimed subject matter. In alternate embodiments, less or more than eight signals may be used to program a memory cell to a predetermined resistance. For example, in some embodiments, as few as one signal, or two or three signals having different durations and different amplitudes may be applied to a memory material of a memory cell to program the memory cell to a predetermined state.

Figure 4:
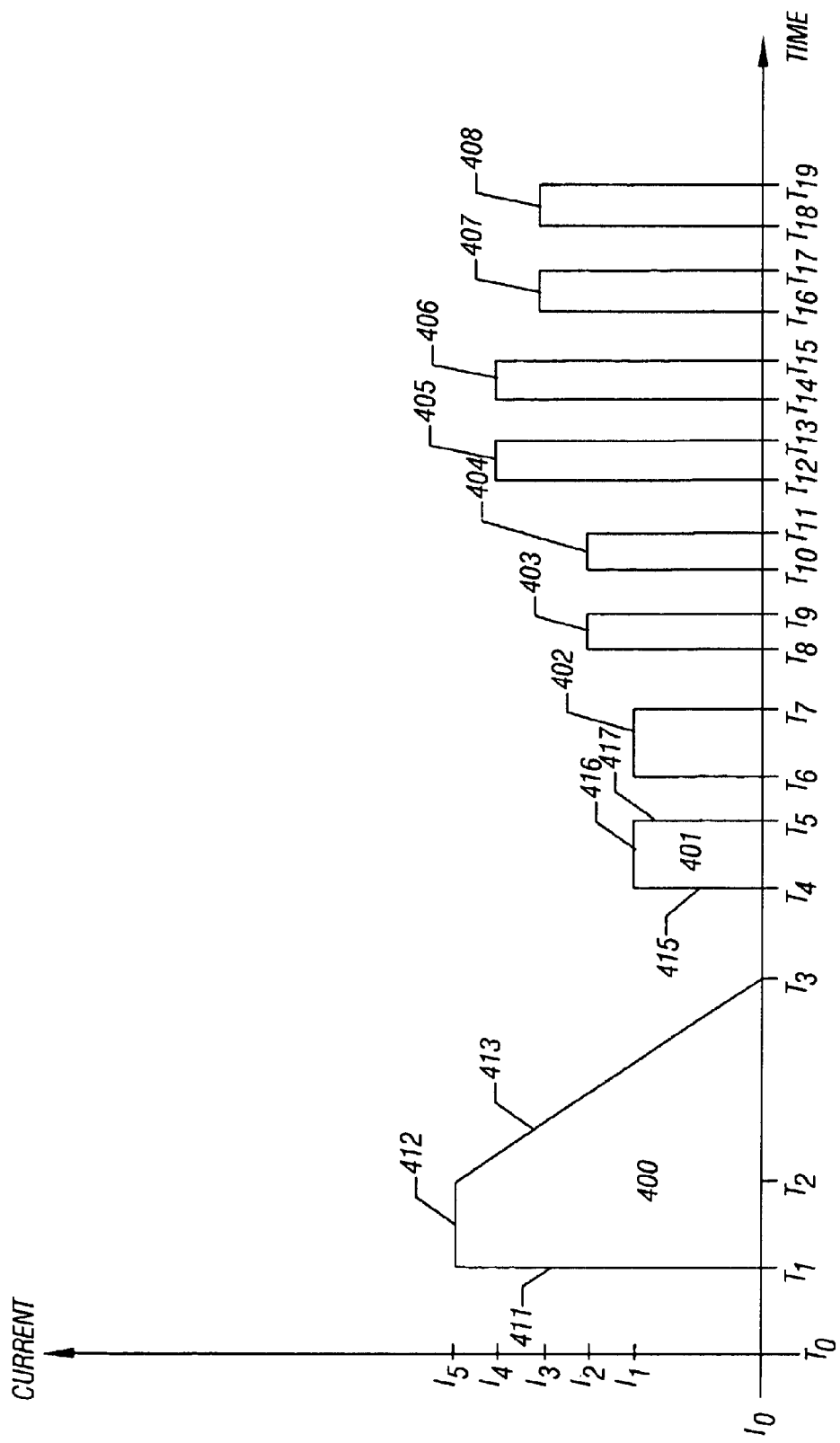
FIG. 4 illustrates another plurality of programming signals in accordance with another embodiment of the claimed subject matter.

Turning to FIG. 4, a plurality of programming signals (400, 401, 402, 403, 404, 405, 406, 407, 408) in accordance with an embodiment of the claimed subject matter are illustrated. In FIG. 4, different times $T_0-T_{19}$ are denoted on a TIME axis and different currents $I_0-I_6$ are denoted on a CURRENT axis.

Signals 400–408 have leading portions that occur prior to or when the signals reach their maximum level, trailing portions that occur after the signals reach their maximum level, and intermediate portions between the leading and trailing portions. For example, signal 400 has a leading portion 411, an intermediate portion 412, and a trailing portion 413 and signal 401 has a leading portion 415, an intermediate portion 416, and a trailing portion 417.

In the embodiment illustrated in FIG. 4, signals 400–408 are current pulses and signal 400 has a substantially greater fall time than signals 401–408. The fall time of a signal may be defined as the time that the trailing portion decreases from a maximum level to a minimum level. In alternate embodiments, the fall time may be defined as the time that the trailing portion decreases from 90% of the maximum level to 10% of the maximum level. As an example, the fall time of signal 400 is the time it takes for trailing portion 413 to decrease from a maximum current amplitude of $I_5$ to a minimum current amplitude of $I_0$, that is, the fall time is the difference between times $T_3$ and $T_2$.

In this embodiment, signal 401 may have a fall time of substantially zero since the trailing portion of signal 401 decreases from its maximum amplitude ($I_1$) to its minimum amplitude ($I_0$) at time $T_5$. Similarly, the fall times of signals 402–408 are substantially zero. Signals 401–408 are substantially rectangular pulses and signal 400 is a substantially nonrectangular pulse. Signals 400 may also be referred to as a triangular pulse.

As mentioned above, signal generator device 160 (FIG. 2) may be adapted to generate programming signals 400–408 to apply to memory cells 140–143. In some embodiments, device 160 may comprise a circuit to set the fall time of programming signals 400–408. For example, device 160 may comprise a circuit to set the fall time of a programming signal by shaping a slope of a trailing portion of the programming signal. Signal generator device 160 may include a circuit comprising a resistor (not shown) and capacitor (not shown) to set the fall time of a programming signal. The resistor and capacitor may be chosen so that the resulting time constant of the resistor and capacitor sets the fall time of the programming signals. In alternate embodiments, device 160 may include a waveshaping circuit (not shown) comprising analog waveshaping circuits such as, for example, integrator/ramp circuits, exponential and logarithmic circuits, etc.

In the embodiment illustrated in FIG. 4, the slopes of leading portion 415 and trailing portion 417 of signal 401 are set to be substantially vertical and the slope of intermediate portion 416 of signal 401 is set to be substantially horizontal. Signal 400 has a leading portion 411 that is set to a substantially vertical slope, an intermediate portion 412 that is set to a substantially horizontal slope and a trailing portion that is set to a negative linear slope.

A programming signal may be shaped by setting the fall time so that the decaying or sloping trailing portion of the programming signal cools the phase change memory material at a rate sufficient to place the memory cell in a desired state. For example, the fall time of the programming signal applied to a phase change material may be increased to reduce the resistance of the phase change material, and conversely, the fall time of the programming signal may be decreased to increase the resistance of the phase change material.

In some embodiments, device 160 may set an amplitude of a programming signal to an amplitude sufficient to heat the phase change material of a memory cell to an amorphizing temperature and place the phase change material in a substantially amorphous state. To keep the phase change material in the substantially amorphous state, the material may be rapidly cooled. This may be accomplished by having a relatively fast fall time for the applied programming signal.

Alternatively, to place the phase change material in a polycrystalline state so that the phase change material has a relatively low resistance, device 160 may set the amplitude of the programming signal to an amplitude sufficient to heat the phase change material to an amorphizing temperature, and set a fall time of the programming signal so that after the memory material reaches the amorphizing temperature, the phase change memory material may cool down at a sufficient rate so that the memory material may be placed in the polycrystalline state.

As may be appreciated from the preceding discussion, application of signals having different amplitudes, durations and fall times to memory cells 140–143 may heat and cool the phase change materials of memory cells 140–143 to set the resistance of the phase change materials, thereby setting the state of the associated memory cell. In other words, in some embodiments, the duration and amplitude of a programming are selected so as to set the resistance of a phase change material to a desired resistance. In addition, the fall time of a signal may be controlled to set the resistance of a phase change material to a desired resistance.

For MLC operation, wherein the phase change materials of memory cells 140–143 have more than two states, signals 400–408 may be used to set the state of the phase change material in a particular memory cell to one of the more than two states. For example, signal 400 may be used to place the phase change material of memory cell 140 to a substantially crystalline state, e.g., state (1,1); signals 401 and 402 may be used to place the phase change material of memory cell 140 in an intermediate state, e.g., state (1,0); signals 403 and 404 may be used to place the phase change material of memory cell 140 in another intermediate state, e.g., state (0,1); and signals 405 and 406 may be used to place the phase change material of memory cell 140 in a substantially amorphous state, e.g., state (0,0).

In alternate embodiments, signals 400–408 may be used to set the state of a memory cell using a feedback approach. For example, to set memory cell 140 to a desired state of, e.g., state (1,1), signal 400 may be initially applied to memory cell 140. Then, read device 150 (FIG. 2) may be used to perform a verify operation to determine if memory cell 140 was programmed to the selected state of (1,1). For example, read device 150 may measure the resistance of the phase change material of memory cell 140, and compare this resistance to a reference resistance to determine if the resistance of the phase change material is above or below the target resistance. After applying signal 400, the resistance of the phase change material may be altered by subsequently applying programming signals 401–408 to memory cell 140. This iterative process of applying programming signals having the same or different amplitudes, durations, and fall times to program memory cell 140 to one of at least three states may be repeated until the desired state (e.g., the desired resistance) of the phase change material is achieved.

As an example, signals 400–408 may be used to set the resistance of the phase change material of memory cell 140 to a resistance level ranging between approximately 8 kohms and 9 kohms. In this example, signal 400, having a relatively greater amplitude, relatively greater fall time, and a relatively longer duration than signals 401–408, may initially be applied to memory cell 140 to set the resistance of the phase change material of memory cell 140 to a relatively low resistance level of, for example, approximately five kohms. In this example, signal 400 may have a maximum amplitude ($I_5$) of approximately 3 milliamps, a duration ($T_3-T_1$) of approximately 1.1 microseconds, and a fall time ($T_3-T_2$) of approximately one microsecond. After applying signal 400 to memory cell 140, the resistance of memory cell 140 may be measured.

Signals 401 and 402 may be applied to memory cell 140 after signal 400. Signals 401 and 402 may each have a maximum amplitude of approximately 1 ma and may each have a duration of approximately 30 ns. In this example, after applying signal 401, the resistance of the phase change material of memory cell 140 may be increased to about 6 kohms. Applying signal 402 following signal 401 to memory cell 140 may increase the resistance of the phase change material of memory cell 140 to about 6.3 kohms.

Signals 403 and 404 may be applied to memory cell 140 after signal 402. Signals 403 and 404 may each have a maximum amplitude of approximately 1.5 ma and may each have a duration of approximately 5 ns. In this example, after applying signal 403 to memory cell 140, the resistance of the phase change material of memory cell 140 may be increased to about 7 kohms. Applying signal 404 following signal 403 to memory cell 140 may set the resistance of the phase change material of memory cell 140 to about 7.5 kohms.

Signals 405 and 406 may be applied to memory cell 140 after signal 404. As an example, signals 405 and 406 may each have a maximum amplitude of approximately 2.5 ma and may each have a duration of approximately 5 ns. In this example, after applying signal 405 to memory cell 140, the resistance of the phase change material of memory cell 140 may be increased to about 9.5 kohms. Applying signal 406 following signal 405 to memory cell 140 may set the resistance of the phase change material of memory cell 140 to about 9.5 kohms.

Signals 407 and 408 may be applied to memory cell 140 after signal 406 to alter the resistance of the phase change material of memory cell 140. In this example, the duration ($T_{17}-T_{16}$) of signal 407 may be approximately equal to the duration of signal 406 and the duration ($T_{15}-T_{14}$) of signal 408 may be approximately equal to the duration of signal 407. Further, the maximum amplitudes ($I_3$) of signals 407 and 408 is less than the maximum amplitude ($I_4$) of signal 406. As an example, signals 407 and 408 may each have a maximum amplitude of approximately 2 ma and may each have a duration of approximately 5 ns. In this example, after applying signal 407 to memory cell 140, the resistance of the phase change material of memory cell 140 may be decreased to about 8.2 kohms. Applying signal 408 following signal 407 to memory cell 140 may set the resistance of the phase change material of memory cell 140 to about 8.5 kohms.

The resistance of the phase change material of memory cell 140 may be measured to determine if the target resistance is reached after application of signals 401–408. In this example, the target resistance level is reached after application of signals 407 and 408.

Figure 5:
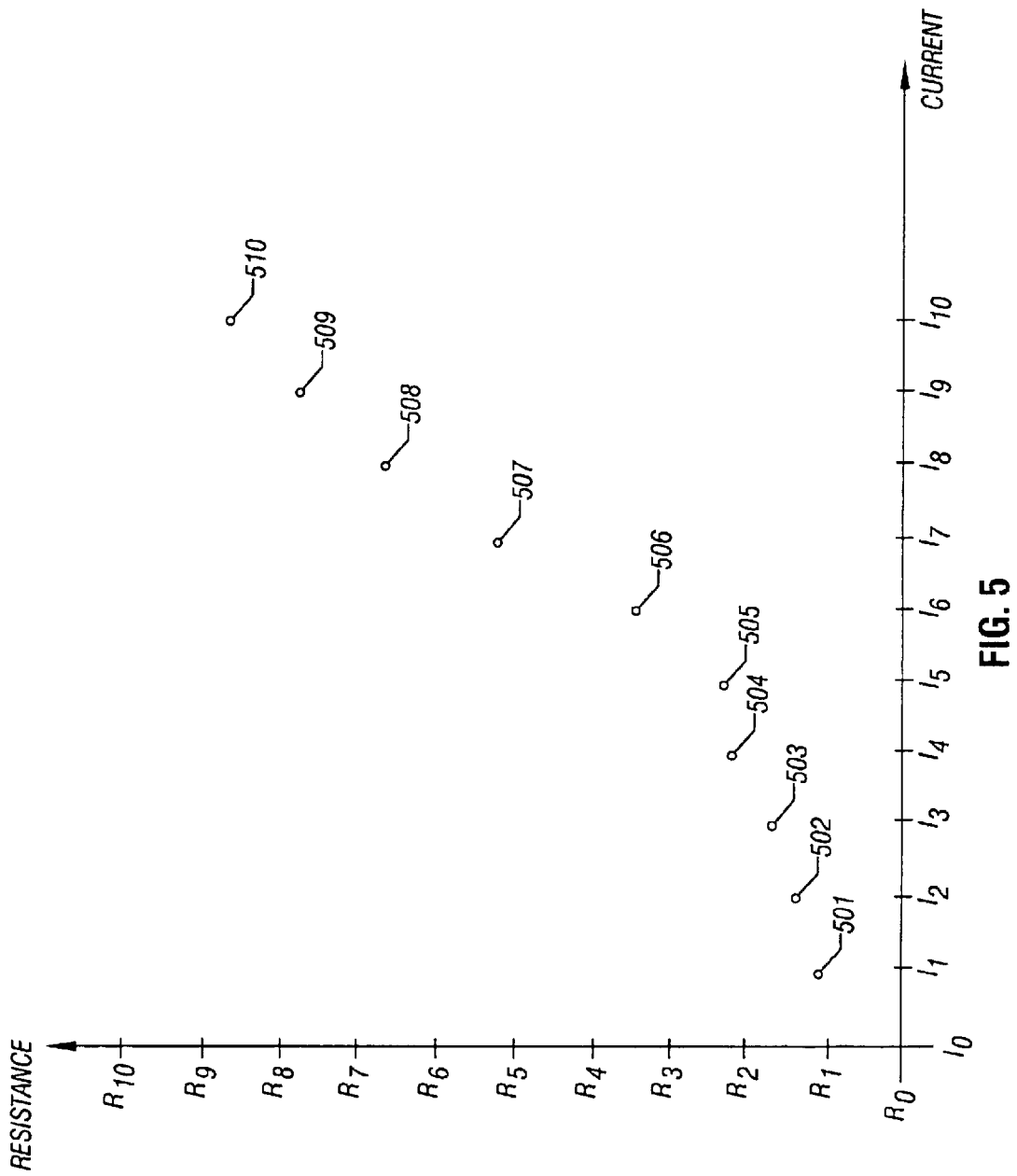
FIG. 5 is a diagram illustrating programming characteristics of a memory cell in accordance with another embodiment of the claimed subject matter.

Turning to FIG. 5, what is shown is a diagram illustrating programming characteristics of a memory cell in accordance with an embodiment of the claimed subject matter. The programming characteristics in FIG. 5 include resulting resistance levels (labeled 501–510) of a memory cell after a current signals having various current magnitudes ($I_1$–$I_{10}$) are applied to the memory cell. In FIG. 5, different resistance levels $R_1$–$R_{10}$ are denoted on a RESISTANCE axis and different current levels $I_0$–$I_{10}$ are denoted on a CURRENT axis. In the example illustrated in FIG. 5, applying greater amounts of current to a particular memory cell results in greater resistance levels within the memory cell.

In the example illustrated in FIG. 5, resulting resistance levels 501, 502, and 503 are within a resistance range having a lower resistance limit of $R_1$ and an upper resistance limit of $R_2$. Resulting resistance levels 504 and 505 are within a resistance range having a lower resistance limit of $R_2$ and an upper resistance limit of $R_3$. Resulting resistance level 506 is within a resistance range having a lower resistance limit of $R_3$ and an upper resistance limit of $R_4$. Resulting resistance level 507 is within a resistance range having a lower resistance limit of $R_5$ and an upper resistance limit of $R_6$. Resulting resistance level 508 is within a resistance range having a lower resistance limit of $R_6$ and an upper resistance limit of $R_7$. Resulting resistance level 509 is within a resistance range having a lower resistance limit of $R_7$ and an upper resistance limit of $R_8$. Resulting resistance level 510 is within a resistance range having a lower resistance limit of $R_8$ and an upper resistance limit of $R_9$.

In some embodiments, programming of a particular memory material may be controlled by limiting setting of the resistance of the particular memory material to a resistance level in a relatively lower resistance range of the spectrum of resistances for the particular memory material. For example, the memory cell illustrated with reference to FIG. 5 has at least two resistance ranges (e.g., a relatively low resistance range bounded by resistances $R_1$ and $R_5$ and a relatively high resistance range bounded by resistances $R_5$ and $R_{10}$). In some embodiments, the resistance of the memory cell may only be set to a resistance level in a relatively low resistance range during storing of information in the memory cell to limit storing in the memory cell to the relatively low range of resistances. In alternate embodiments, the region of operation of resistance programming of a particular memory cell may be limited to a relatively crystalline operating region. Setting resistance of a memory cell only to a relatively low resistance range or a relatively crystalline operating region to limit programming of the particular memory cell may reduce power consumption in the system. Lower power consumption may be achieved since lower current magnitudes are used to program the memory. In addition, the endurance of a memory cell may be increased since programming with lower current magnitudes may reduce the operating temperatures of the memory cells. Also, in some memories, the resistance of a material may drift as the operating temperature varies. Limiting programming of the memory material to relatively low resistances may reduce drifting of the programmed resistance of a memory cell.

In some embodiments, the duration and amplitude of a programming signal are selected so as to set the resistance of a phase change material to a lower portion of a relatively low range of resistances with temperature since the low resistance state has a lower temperature coefficient as compared to the higher resistance state. In some embodiments, adjusting a higher resistance to be lower may be done not only with a lower current but also with a wider and increasingly wider pulse width. In addition, the fall time of a signal may be controlled to set the resistance of a phase change material to a lower portion of a relatively low range of resistances.

As an example, FIG. 5 may illustrate programming characteristics for programming memory cell 140 (FIG. 2). Although the scope of the claimed subject matter is not limited in this respect, resistances $R_0$–$R_{10}$ may correspond to resistance levels of 0 ohms, 10 kohms, 20 kohms, 30 kohms, 40 kohms, 50 kohms, 60 kohms, 70 kohms, 80 kohms, 90 kohms, and 100 kohms, respectively. Currents $I_0$–$I_{10}$ may correspond to current levels of 0 amperes, 1 ma, 1.2 ma, 1.3 ma, 1.4 ma, 1.5 ma, 1.6 ma, 1.7 ma, 1.8 ma, 1.9 ma, and 2 ma, respectively. In this example, programming of memory cell 140 may be controlled by limiting or restricting the programming resistance range to a resistance range between approximately zero ohms (e.g., $R_0$) and approximately 40 kohms (e.g., $R_4$). In this example, this may be accomplished by limiting the allowable programming signals to those signals having current magnitudes between approximately 0 amperes (e.g., $I_0$) and approximately 1.6 ma (e.g., $I_6$). As may be appreciated, restricting programming to a selected resistance range may allow for either single-bit or multi-bit storage in a memory cell since multiple resistance levels may be realized in the memory cell.

Conversely, in other embodiments, the resistance of the memory cell may only be set to a resistance level in a relatively high resistance range during storing of information in the memory cell to limit storing in the memory cell to the relatively high range of resistances. For example, programming of the memory cell illustrated with reference to FIG. 5 may be controlled by limiting the programming resistance range to a relatively high resistance range between resistance $R_5$ and resistance $R_{10}$.

In addition, in some embodiments, a learning algorithm may be provided to store what programming characteristics are used to achieve certain resistance levels. For example, in the example illustrated in FIG. 5, signals having current magnitudes of $I_1$–$I_{10}$ are used to achieve resistance levels 501–510. The learning algorithm may be done by row or column or array or chip. These programming characteristics may be stored in memory device 115 (FIG. 1) along with other data and instructions. These programming characteristics may be adjusted during manufacturing or in the field to compensate for variations in memory device 115.

Figure 6:
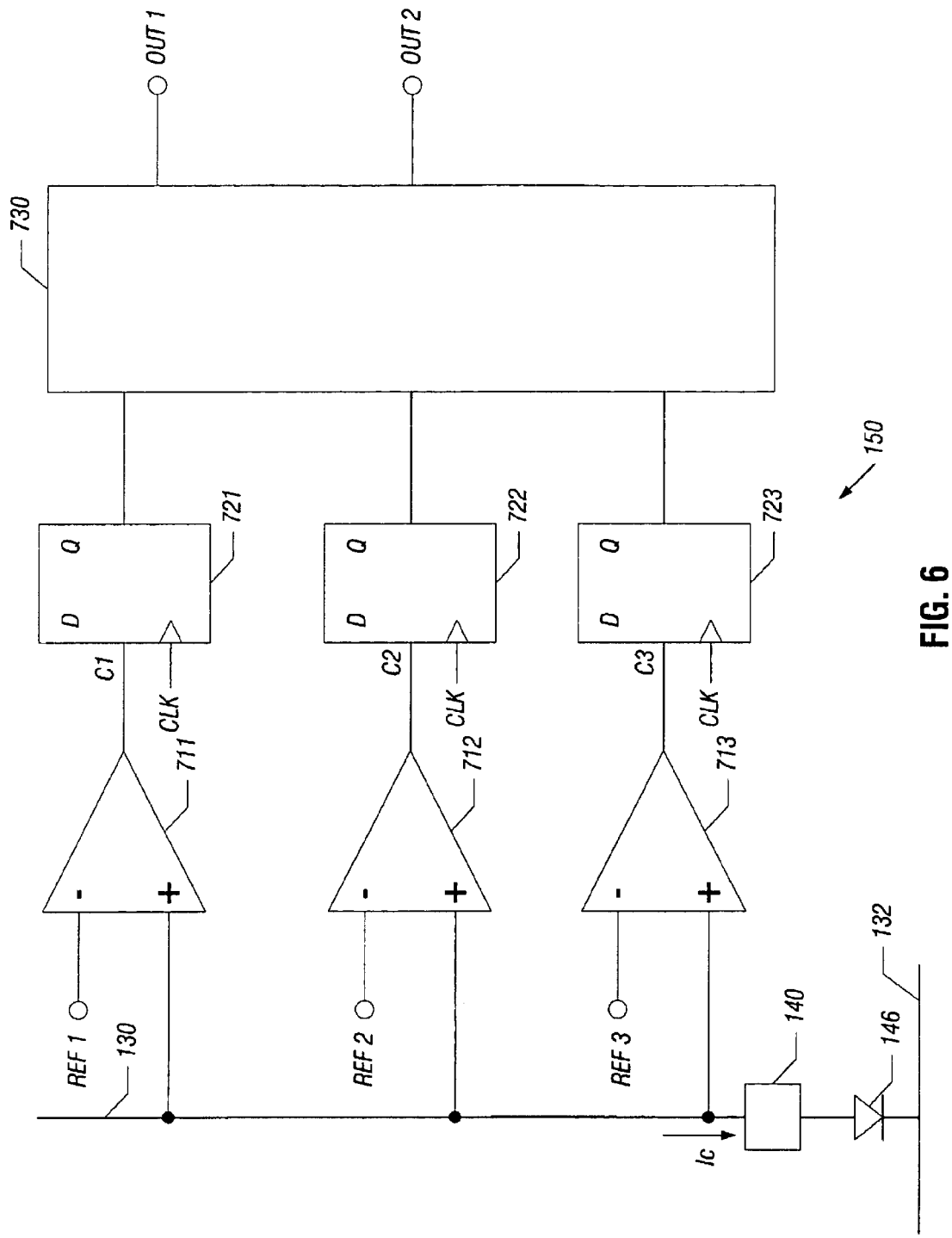
FIG. 6 illustrates a read circuit in accordance with an embodiment of the claimed subject matter.

Turning to FIG. 6, an embodiment of read device 150 in accordance with the claimed subject matter is provided. For binary MLC operation, three comparators 711, 712, and 713 may be used to detect a memory state of a particular memory cell, e.g., memory cell 140. The noninverting input terminals of a comparators 711–713 may be connected to memory cell 140 to receive an indication of the resistance of memory cell 140. The inverting input terminals of comparators 711, 712, and 713 may be connected to reference voltage signals REF1, REF2, and REF3, respectively. The output terminals of comparators 711, 712, and 713 may be connected to the D input terminals of D flip-flops 721, 722, and 723, respectively. A read current, labeled Ic, may be used to generate a read voltage that may be received at the noninverting input terminals of comparators 711–713. The read voltage is indicative of the resistance of memory cell 140, and therefore, may be used to indicate the state of memory cell 140.

The comparison of the read voltage to the reference voltages results in output signals C1, C2, and C3 that may be used to indicate the state of memory cell 140 and may be stored in flip-flops 721–723. The output terminals of flip-flops 721–723 may be connected to an encode circuit 730 that may generate signals OUT1 and OUT2 at its output terminals.

Reference voltage signals REF1, REF2, and REF3 have the following voltage relationship: REF1>REF2>REF3. As a result of this arrangement, for a relatively higher resistive state of memory cell 140, comparators 711, 712, and 713 may respectively generate output signals C1, C2, and C3 having a logic high voltage potential ("H"), and may be defined as state (0,0). Conversely, for a relatively lower resistive state of memory cell 140, comparators 711, 712, and 713 may respectively generate output signals C1, C2, and C3 having a logic low voltage potential ("L") and may be defined as state (1,1). The following truth table illustrates an embodiment of a truth table for encode circuit 730:

| C1 | C2 | C3 | OUT1 | OUT2 | State |
|---|---|---|---|---|---|
| L | L | L | 1 | 1 | (1, 1) |
| L | L | H | 1 | 0 | (1, 0) |
| L | H | H | 0 | 1 | (0, 1) |
| H | H | H | 0 | 0 | (0, 0) |

The timing associated with the generation of the programming signals may be determined by timing device 170 (FIG. 2). Timing device 170 may provide control signals to signal generator device 160 and read device 150 so that devices 150 and 160 either measure the resistance of a memory cell (read operation or program verify operation) or provide the programming pulses at the correct timing to the selected memory cell. Accesses to the memory cell may be in random fashion where a memory cell may be accessed individually, or it may be on a row by row or column by column basis.

Figure 7:
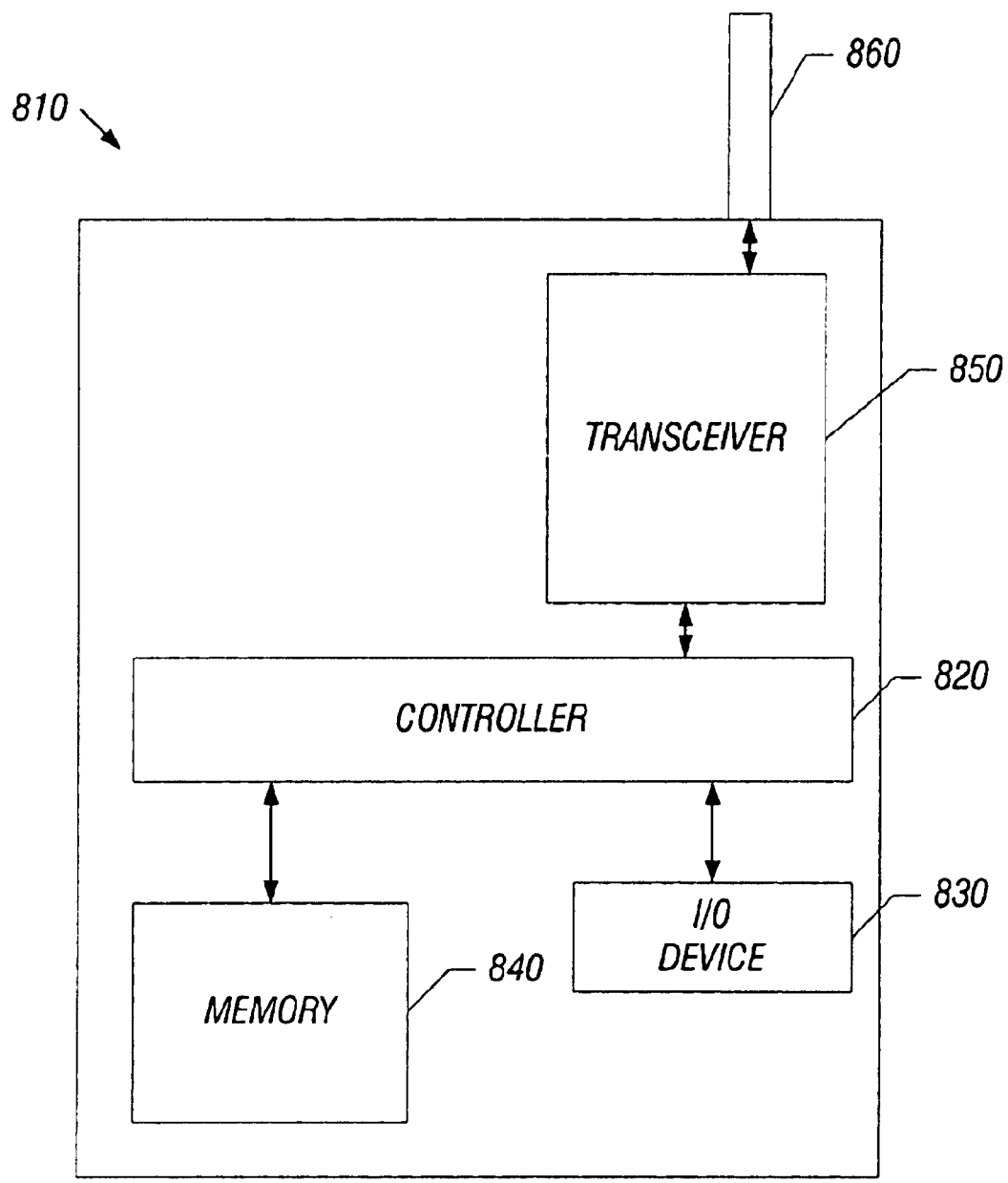
FIG. 7 is a block diagram illustrating a portable communication device in accordance with an embodiment of the claimed subject matter.

Turning to FIG. 7, portable communication device 810 in accordance with an embodiment of the claimed subject matter is described. Portable communication device 810 may include a controller 820, an input/output (I/O) device 830 (e.g. a keypad, display), a memory 840, and a wireless transceiver 850 that may be connected to an antenna 860, although the scope of the claimed subject matter is not limited to embodiments having any or all of these components.

Controller 820 may comprise, for example, one or more microprocessors, digital signal processors, microcontrollers, or the like. Memory 840 may be used to store messages transmitted to or by portable communication device 810. Memory 840 may also optionally be used to store instructions that are executed by controller 820 during the operation of portable communication device 810, and may be used to store user data. Memory 840 may be provided by one or more different types of memory. For example, memory 840 may comprise a volatile memory (any type of random access memory), a non-volatile memory such as a flash memory and/or a phase change memory such as, for example, phase change memory device 115 illustrated in FIG. 2.

I/O device 830 may be used by a user to generate a message. Portable communication device 810 may use transceiver 850 with antenna 860 to transmit and receive messages to and from a wireless communication network with a radio frequency (RF) signal.

Although the scope of the claimed subject matter is not limited in this respect, portable communication device 810 may use one of the following communication air interface protocols to transmit and receive messages: Code Division Multiple Access (CDMA), cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like.

While certain features of the invention have been illustrated and described herein, many modifications, substitutions, changes, and equivalents will now occur to those skilled in the art. For example, although some of the embodiments illustrated herein discuss a memory cell comprising a phase change material, the methods illustrated herein for storing information may also be applied to other memory technologies such as, for example, a flash memory. It is, therefore, to be understood that the appended claims are intended to cover all such modifications and changes as fall within the true spirit of the invention.

What is claimed is:

1. A method comprising:
    defining a first and second range of resistance values of a phase change memory, wherein the memory is more crystalline in the first range than in the second range; and
    limiting the programming of the memory to resistance values in the first range.

2. The method of claim 1, including applying a first signal to the memory followed by applying a second signal to the memory, wherein the second signal has a duration less than the duration of the first signal.

3. The method of claim 2, where an amplitude of the first signal is less than an amplitude of the second signal.

4. The method of claim 2, further defining a first subrange and a second subrange of said first range, the first subrange being more crystalline than the second subrange, and selecting an amplitude and duration of the first signal to set the resistance of the memory to the first subrange.

5. The method of claim 2, further comprising determining the resistance of the memory after applying the second signal.

6. The method of claim 2, further applying a third signal to the memory if the resistance of the memory is less than a predetermined resistance level, wherein the third signal has an amplitude greater than the amplitude of the second signal and has a duration less than the duration of the first signal.

7. The method of claim 2, further comprising applying a third signal to the memory if the resistance of the memory is greater than a predetermined resistance level, wherein the third signal has an amplitude less than an amplitude of the second signal and has a duration less than the duration of the first signal.

8. The method of claim 1, wherein limiting the memory to a resistance value in the first range includes applying three signals having different amplitudes and different durations to the memory.

9. The method of claim 1, including defining a first and second range of resistance values of a phase change memory including a chalcogenide.

10. A method of altering a resistance of a memory material to store information in the memory material, wherein the memory material has at least a first range of resistances and a second range of resistances and wherein the first range of resistances is less than the second range of resistances, the method comprising:
    setting the resistance of the memory material only to a resistance level in the second range of resistances during storing of information to limit storing in the memory material to the second range of resistances by applying a first signal to the memory material followed by applying a second signal to the memory material, wherein the second signal has a duration of less than a duration of the first signal.

11. The method of claim 10, further comprising selecting an amplitude and the duration of the first signal to set the resistance of the memory material to a lower portion of the second range of resistances.

12. The method of claim 10, wherein the memory material is a phase change material.

13. A method, comprising:
applying three signals having different durations and different amplitudes to a memory material to program the memory material to a predetermined state; and
determining whether the memory material is in the programmed state after the three signals are applied to the memory material by comparing a resistance of the memory material to a reference resistance.

14. The method of claim 13, wherein applying three signals comprises applying a first signal, a second signal, and a third signal to the memory material and wherein the duration of the first signal is greater than the duration of the second signal and the duration of the second signal is greater than the duration of the third signal.

15. The method of claim 14, wherein the second signal is applied to the memory material after the first signal is applied to the memory material and wherein the third signal is applied to the memory material after the second signal is applied to the memory material.

16. The method of claim 14, further comprising applying the first signal, the second signal, and a fourth signal to the memory material to program the memory material to a second predetermined state, wherein an amplitude of the fourth signal is greater than an amplitude of the third signal.

17. The method of claim 16, further comprising applying the first signal, the second signal, and a fifth signal to the memory material to program the memory material to a third predetermined state, wherein an amplitude of the fifth signal is greater than an amplitude of the third signal.

18. The method of claim 14, wherein the first signal is a substantially nonrectangular pulse and the second and third signals are substantially rectangular pulses.

19. The method of claim 13, wherein the memory material is a phase change material.

20. The method of claim 13, further comprising:
applying a fourth signal to the memory material if a resistance of the memory material is greater than the reference resistance, wherein an amplitude of the fourth signal is different than an amplitude of the third signal.

21. The method of claim 13, wherein programming the memory material to a predetermined state comprises altering a resistance of the memory material, wherein the memory material has at least two ranges of resistances, and further comprising restricting programming of the memory material to a lower range of resistances of the two range of resistances.

22. The method of claim 21, further comprising selecting the amplitudes and the durations of the three signals so as to restrict programming of the phase change material to the lower range of resistances.

23. A system, comprising:
a controller;
a memory comprising a phase change material, wherein the memory is coupled to the controller;
a device to apply signals to the phase change memory to program the phase change memory to at least one predetermined state; and
a comparator to compare the resistance of the memory material to a reference resistance.

24. The system of claim 23, further comprising a read device coupled to the memory to measure resistance of the phase change material.

25. A method comprising:
setting the resistance of a memory material by applying a first signal to the memory material; and
after applying the first signal, applying a second signal to the memory material, wherein the second signal has a duration of less than a duration of the first signal.

26. The method of claim 25 where an amplitude of the first signal is less than an amplitude of the second signal.

27. The method of claim 25 further comprising selecting an amplitude and duration of the first signal to set the resistance of the memory material to fall within a more crystalline region of a range of resistance values.

28. The method of claim 25 further comprising determining the resistance of the memory material after applying the second signal.

29. The method of claim 25 including applying a third signal to the memory material if the resistance of the memory material is less than a predetermined resistance level, wherein the third signal has an amplitude greater than an amplitude of the second signal and has a duration less than the duration of the first signal.

30. The method of claim 25 further including applying a third signal of the memory material if the resistance of the memory material is greater than a predetermined resistance level, wherein the third signal has an amplitude less than an amplitude of the second signal and a duration less than the duration of the first signal.

31. A method comprising:
applying a first pulse to program a phase change memory device to a first resistance level and a first of two possible resistance states; and
applying a second pulse to reduce the resistance level of said device to a lower resistance level in said first state.

32. The method of claim 31 including determining the resistance level of said device after said first pulse.

33. The method of claim 32 including comparing said resistance level to a reference resistance level.

* * * * *